United States Patent [19]

Nakano

[11] Patent Number: 4,733,461

[45] Date of Patent: Mar. 29, 1988

[54] METHOD OF STACKING PRINTED CIRCUIT BOARDS

[75] Inventor: Tsuyoshi Nakano, Tokyo, Japan

[73] Assignee: Micro Co., Ltd., Tokyo, Japan

[21] Appl. No.: 903,568

[22] PCT Filed: Dec. 24, 1985

[86] PCT No.: PCT/JP85/00704

§ 371 Date: Aug. 18, 1986

§ 102(e) Date: Aug. 18, 1986

[87] PCT Pub. No.: WO86/04208

PCT Pub. Date: Jul. 17, 1986

[30] Foreign Application Priority Data

Dec. 28, 1984 [JP] Japan ............................ 59-274368
Jan. 21, 1985 [JP] Japan ............................ 60-007547
Feb. 16, 1985 [JP] Japan ............................ 60-027553
May 8, 1985 [JP] Japan ............................ 60-066991

[51] Int. Cl.$^4$ .............................................. H05K 3/36
[52] U.S. Cl. .................................. 29/830; 361/412; 439/61
[58] Field of Search .......... 29/830; 339/17 M, 17 LC, 339/17 LM; 361/412; 439/61

[56] References Cited

U.S. PATENT DOCUMENTS 3,300,686  1/1967  Johnson et al. ............... 339/17 M
3,614,541 10/1971  Farrand ......................... 361/412 X
4,133,592  1/1979  Cobaugh et al. .......... 339/17 LC X
4,533,976  8/1985  Suwa ........................... 339/17 M X
4,603,928  8/1986  Evans ........................... 339/17 LM

FOREIGN PATENT DOCUMENTS 555476   6/1978  Japan .
55-5476  1/1980  Japan .
5714975  6/1980  Japan .
57-14975 1/1982  Japan .

Primary Examiner—Howard N. Goldberg
Assistant Examiner—Carl J. Arbes
Attorney, Agent, or Firm—Toren, McGeady & Associates

[57] ABSTRACT

A method for stacking, on a mother board in high density, N printed circuit boards which are formed, respectively, in the same size and shape of a regular N-sided polygon, where N is an integer not less than three. The mother board is provided, at a position corresponding to one side of the regular N-sided polygon, with a first connector, and is provided, at 360/N-degree intervals around the center point of the regular N-sided polygon, with N second connectors for selecting the printed circuit boards. Terminals of a data bus line, and address bus line, and a timing signal line for reading/writing data are arranged in the first connector. Each of the N printed circuit boards is provided, on one face thereof at one side of the regular N-sided polygon, with a third connector, is provided, on the opposite face thereof at an adjacent side to the side having the third connector, with a fourth connector, and further is provided, on both faces thereof penetrating therethrough at positions confronting the N second connectors of the mother board, with N fifth connectors for coupling to the second connectors. Each of the terminals of the fourth connector is connected correspondingly to each of the terminals of the third connector on the board. The N printed circuit boards are stacked on the mother board by rotating, through 360/N degrees, each printed circuit board with respect to the board it is overlying.

10 Claims, 24 Drawing Figures

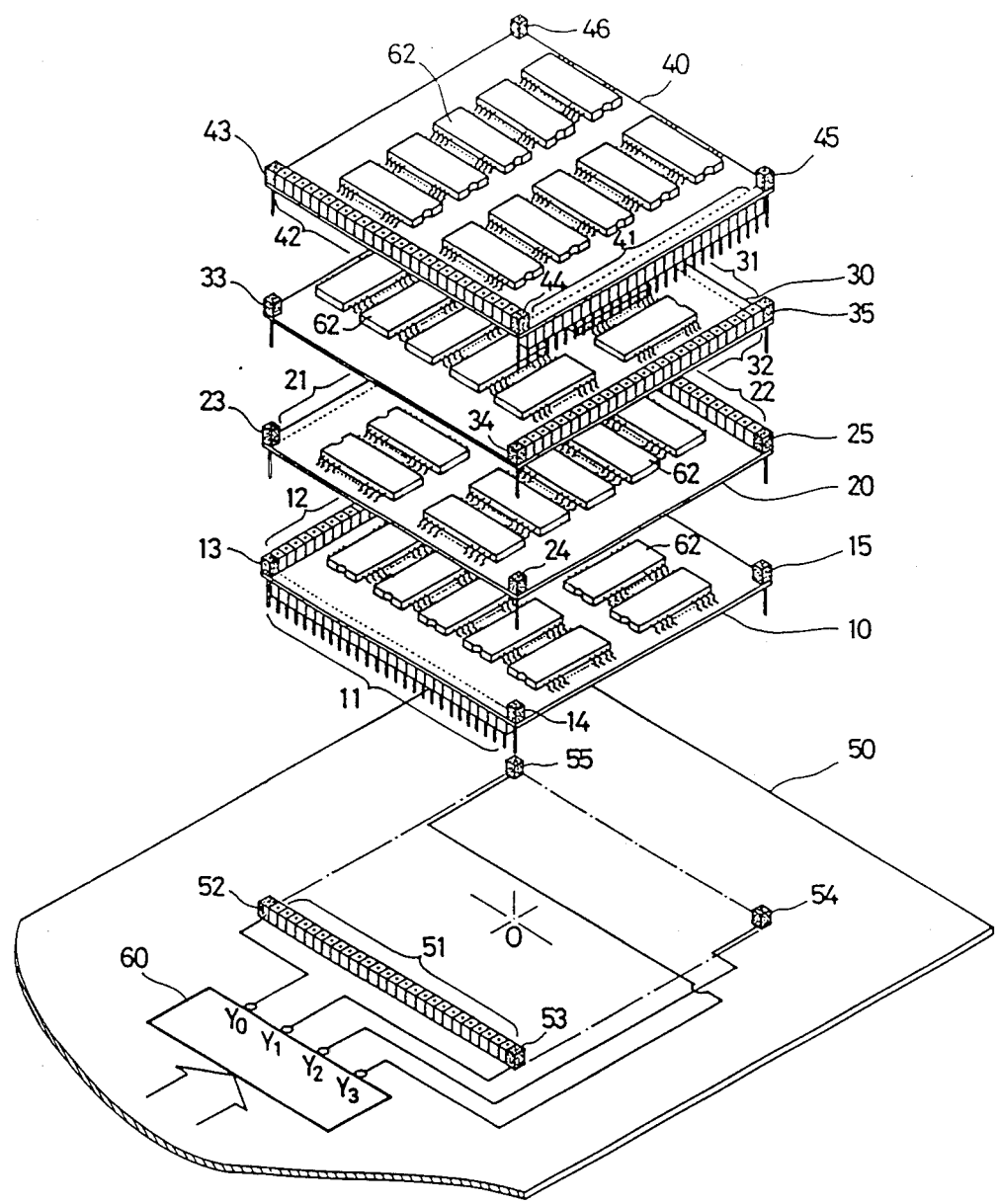
F I G. 1

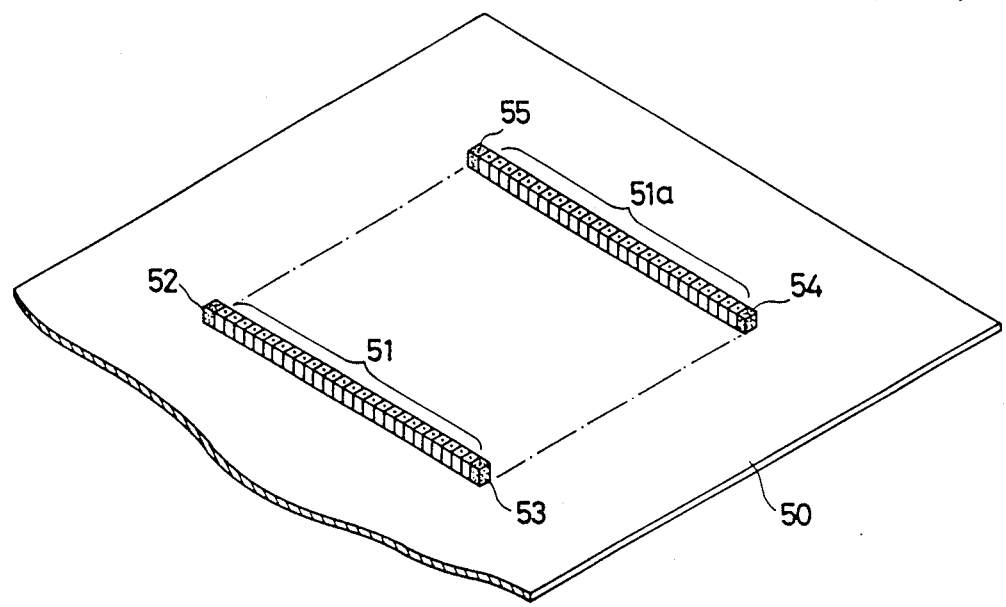
F I G. 8
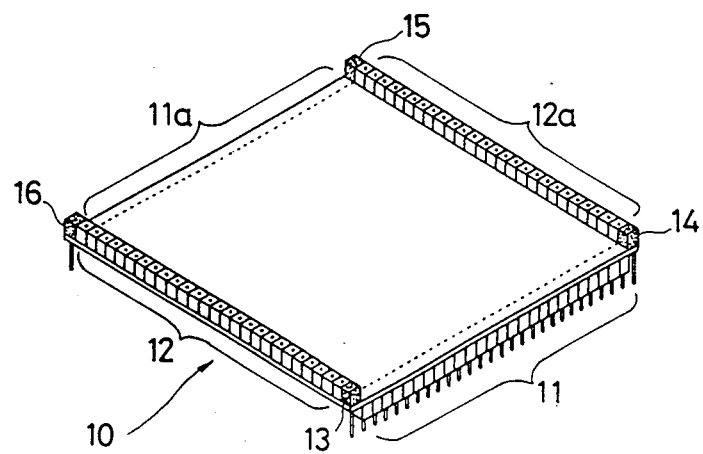
F I G. 9

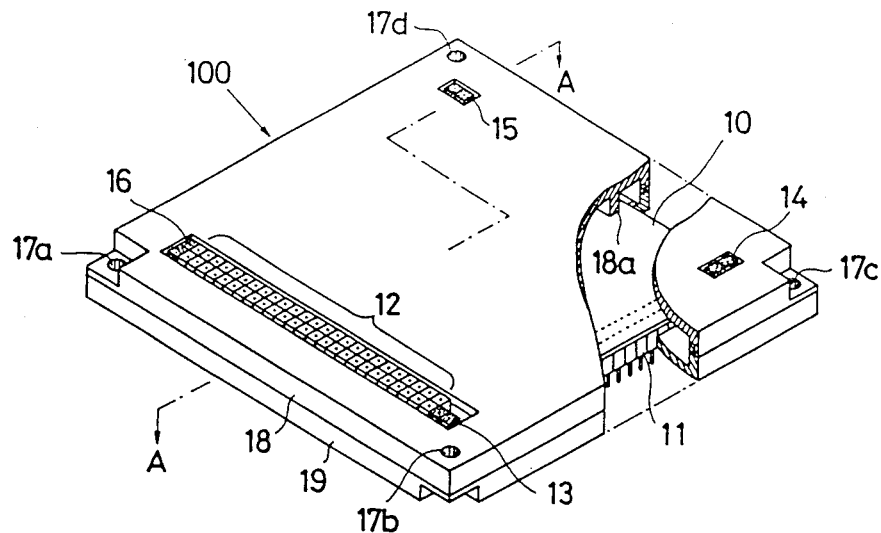
F I G. 14
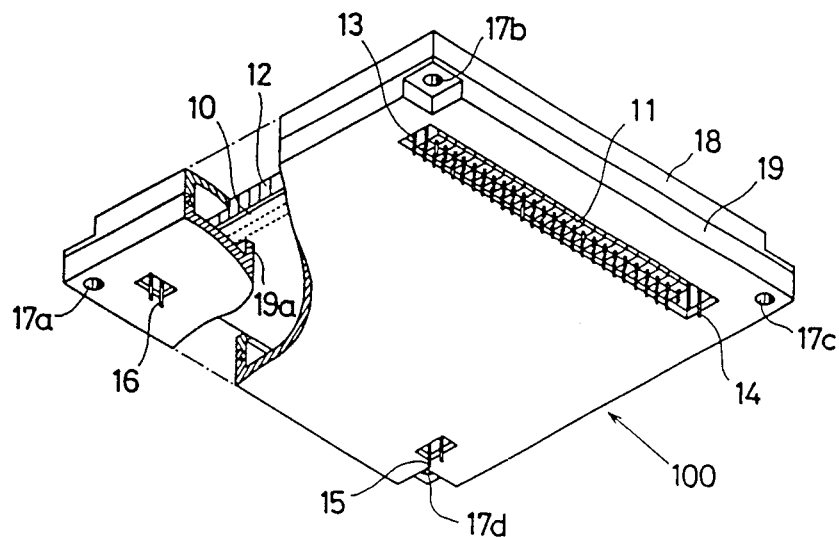
F I G. 15

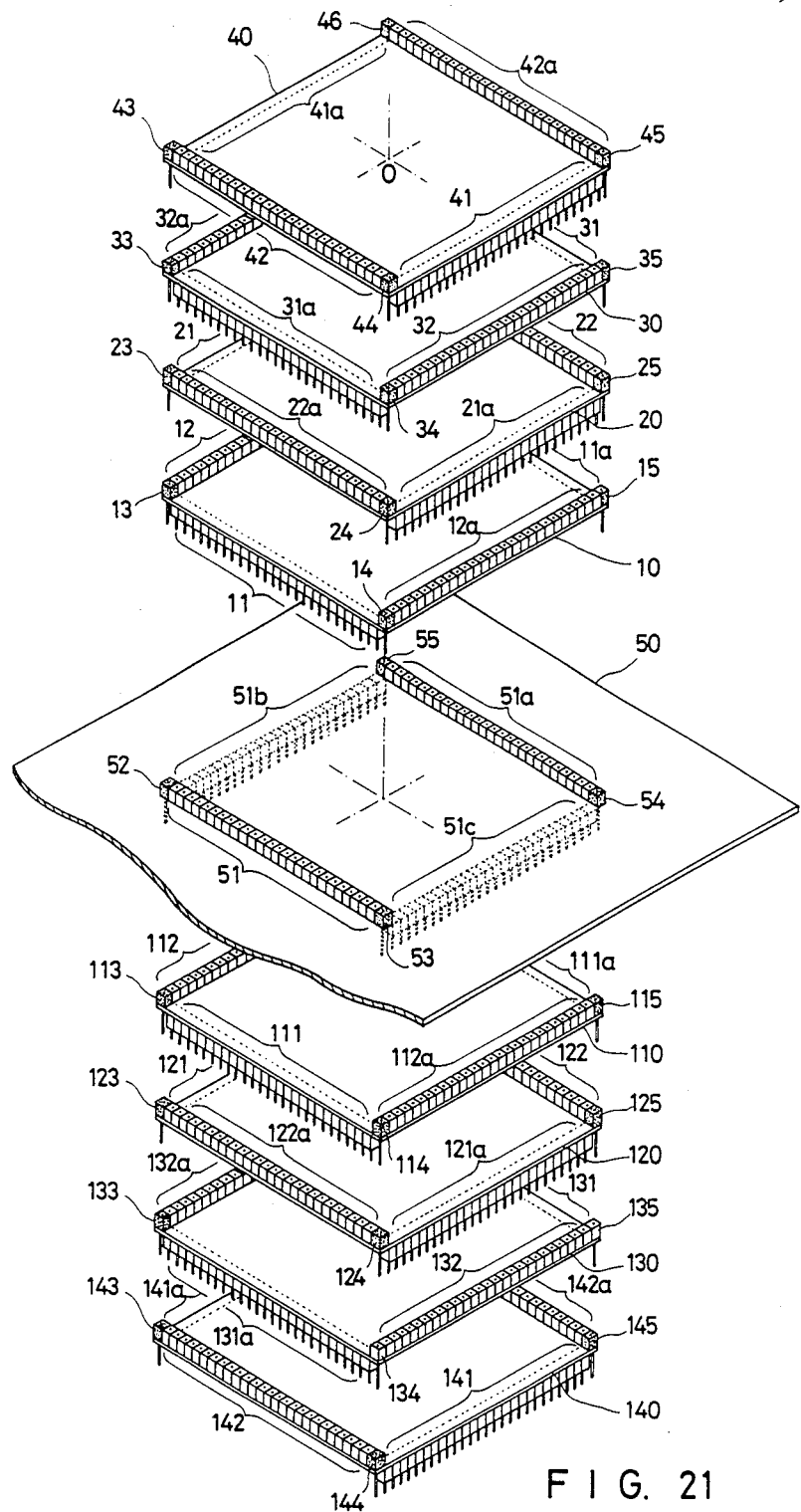
F I G. 21

METHOD OF STACKING PRINTED CIRCUIT BOARDS

TECHNICAL FIELD

This invention relates to a method of stacking on a mother board, to which a common bus and a receptive connector are attached, a plurality of memory boards or other printed circuit boards of the same specification in multiple layers so as to mount them in high density.

BACKGROUND ART

Conventionally, as a means of increasing the memory capacity of an IC (integrated circuit), memory chips are attached to a printed circuit board and this single printed circuit board is mounted on a mother board. When intending to increase the memory capacity furthermore, the method of mounting other printed circuit boards on the printed circuit board is conceivable. For example, as shown in FIG. 24, two lines of connectors 1a and 1b are provided on the bottom face of a printed circuit board 1 corresponding to two lines of connectors 5a and 5b arranged spaced from each other on a mother board 5. Connectors 1c and 1d are provided on the top face of the board 1 so as not to overlap the connectors 1a and 1b. The terminals of the connectors 1a and 1c and the terminals of the connectors 1b and 1d are connected in a corresponding relationship. A printed circuit board 2 is composed in the same size and shape as the printed circuit board 1. In order to stack the above printed circuit boards 1 and 2, the printed circuit board 1 is mounted on the mother board 5 by connecting the connectors 1a and 1b of the board 1 to the connectors 5a and 5b of the board 5, respectively. The printed circuit board 2 is mounted on the board 1 by connecting the connectors 2a and 2b provided on the bottom face of the board 2 to the connectors 1c and 1d, respectively. A repetition of such construction enables increase of the memory capacity.

However, in the case where the above printed circuit boards 1 and 2 have been mounted on the mother board 5, an additional space "t" shown in FIG. 24 is required on the mother board 5 in comparison with the case where only the printed circuit board 1 has been mounted, so that it is impossible to mount parts in high density on the mother board 5.

Another method is to separately arrange a signal terminal (not shown) for selecting a printed circuit board in the mother board and supply each selecting signal of the printed circuit boards to the corresponding printed circuit board from the signal terminal. When this method is employed, all the circuit boards can be formed in the same specification by wiring separately by cables. This, however, is unpreferable because the reliability of the connectors and the cables comes into question. When providing a passing route of the selecting signal on the lower printed circuit board, terminals of the connector which connects to the signal terminal for selecting the circuit board are located in different positions on the upper and lower circuit boards, so that it is impossible to make all the printed circuit boards the same specification.

Furthermore, there is a method of deriving a selecting signal from address signals of memories on the printed circuit boards. When using this, all wiring around the connectors becomes completely the same and no selecting signal need be supplied from the mother board. However, the circuit composition to derive the selecting signal differs. By providing the printed circuit board with a selector switch or taking other measures, the circuit pattern may be made uniform. However, this is not preferable because the reliability of the switch comes into question and the possibility of setting error arises.

Consequently, it is difficult to mount the above printed circuit boards in high density and it is necessary to produce each layer of the printed circuit boards with separate specifications, so that there is a problem that printed circuit boards are unsuited for mass production and costs rise.

This invention resolves the above problem. It has as its object the provision of a method of stacking printed circuit boards, in which the stacked printed circuit boards are composable in the same specification in terminal arrangement and wiring pattern so as to be suitable for mass production. This invention has as another object the provision of a method of stacking printed circuit boards, in which high density mounting is possible without increasing the projection area on the mother board even when many boards are stacked.

This invention has as still another object the provision of a method of stacking printed circuit boards, in which the printed circuit boards can be mounted strongly and with high reliability board on the mother board.

DISCLOSURE OF INVENTION

To achieve the above objects, in the case of mounting a plurality of printed circuit boards on a mother board by stacking, N sheets of printed circuit boards are formed, respectively, in the same size and shape of a regular N-sided polygon (the symbol N is an integer not less than three). The mother board is provided, at a position corresponding to one side of the regular N-sided polygon, with a first connector and is provided, at 360/N-degree intervals around the center point of the regular N-sided polygon, with N second connectors. Terminals of a data bus line, of an address bus line, and of a timing signal line for reading/writing data are arranged in the first connector. The second connector is a connector for selecting the printed circuit boards and consists of one or more terminals. Each of the N sheets of the printed circuit boards is provided on one face thereof at one side of the regular N-sided polygon with a third connector. Each of the boards is provided on the opposite face thereof at a side adjacent to the side having the third connector with a fourth connector. Each of the boards is provided on both faces thereof penetrating therethrough at positions confronting the N second connectors of the mother board, with N fifth connectors for coupling to the N second connectors, respectively. The terminal arrangement of the third connector is the same as that of the first connector. Each of the terminals of the fourth connector is connected to each of the terminals of the third connector on the circuit board, respectively. The N sheets of the printed circuit boards are stacked on the mother board rotated one side at a time. All of the N sheets of the printed circuit board may be stacked on a single face of the mother board. Also, part of them may be stacked on one face of the mother board and the rest on the opposite face. The fourth connector of a printed circuit board is connected to the first connector of the mother board through the third connector. A third connector of a next printed circuit board is coupled to the fourth connector. By transmitting a selecting signal from a second connector of the mother board through a corresponding fifth connector, a desired printed circuit board is selected among the N sheets of the stacked printed circuit boards. Consequently, all the N sheets of the printed circuit boards are composable in the same specification and mountable in high density without increasing the projection area on the mother board even when many boards are stacked on the mother board.

In addition to the above constitution, this invention is composed so that each of the printed circuit boards is encased and held in a package comprising an upper lid and a lower lid. The package is apertured at parts where the third, the fourth, and the fifth connectors of the stacked printed circuit boards are interconnected. Through holes are provided at four corners of the package. After stacking two packages, fasteners are inserted into the through holes of two non-adjacent corners among through holes of the four corners so as to fix the packages to each other. Consequently, the stacked layers of the printed circuit boards do not deform and the upper printed circuit boards never become unstable by external force.

Also, in this invention, when stacking not less than four printed circuit boards, a mother board is provided with an eighth connector for increasing a first connector and a printed circuit board is provided with ninth and 10th connectors for increasing third and fourth connectors, respectively. The increased connectors are provided so as not to be adjacent to the existing connector. Thus, the stacked printed circuit boards are fixed at two sides and become stable.

Furthermore, in this invention, when stacking not less than four printed circuit boards, the mother board is further provided on the bottom face with 11th and 12th connectors corresponding to the first and eighth connectors attached to the top face of the mother board, respectively. When stacking printed circuit boards on the top face of the mother board, the third and ninth connectors of the printed circuit board are coupled to the first and eighth connectors of the mother board, respectively. When stacking printed circuit boards on the bottom face of the mother board, the fourth and 10th connectors of the printed circuit board are coupled to the 11th and 12th connectors of the mother board, respectively. Thus, the stacked printed circuit boards are fixed at two sides, so that the printed circuit boards become stable in structure and will not readily detach from the mother board.

BRIEF DESCRIPTION OF DRAWINGS

FIG. 1 is a perspective assembly view of a method for stacking printed circuit boards in a first embodiment of this invention;

FIG. 8 is a partial, perspective view of a mother board of a fourth embodiment of this invention;

FIG. 9 is a perspective view of a first printed circuit board;

FIG. 14 is a partially cutaway perspective view of a package encasing a first printed circuit board seen from above;

FIG. 15 is a partially cutaway perspective view of the package of FIG. 14 seen from below;

FIG. 21 is a perspective assembly view in a method of stacking printed circuit boards of a sixth embodiment of this invention;

BEST MODE OF CARRYING OUT THE INVENTION

Figure 2:
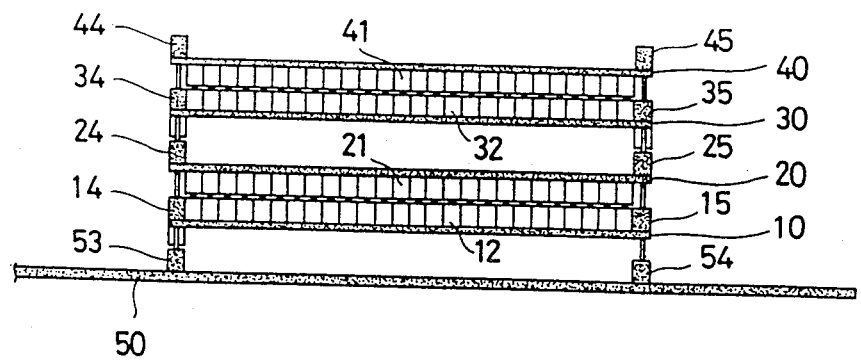
FIG. 2 is a front view in the stacked condition.

Embodiments of this invention will now be explained in detail on the basis of the drawings. As shown in FIGS. 1 and 2, in this embodiment, four printed circuit boards 10, 20, 30, and 40 are stacked on a mother board 50. All the boards 10, 20, 30, and 40 are formed, respectively, in the same size and shape, i.e., a regular rectangle (hereinafter referred to as "square").

The mother board 50 is provided, at a position corresponding to one side of the square form board 10, with a first connector 51 (dash line) and is provided, at four corners of the square, with second connectors 52, 53, 54, and 55, i.e., 90-degree intervals around the center point "O" of the square. The first connector 51 is a female connector, in which terminals of a data bus line, of an address bus line, and of a timing signal line for reading/writing data are arranged. Each of the second connectors 52, 53, 54, and 55 is a female connector for selecting one board among the boards 10, 20, 30, and 40. It consists of a single terminal in this embodiment. Each of terminals $Y_0$, $Y_1$, $Y_2$, and $Y_3$ of a decoder 60 is connected to the second connectors 52, 53, 54, and 55, respectively. An address bus line is fed to the decoder 60.

Figure 3:
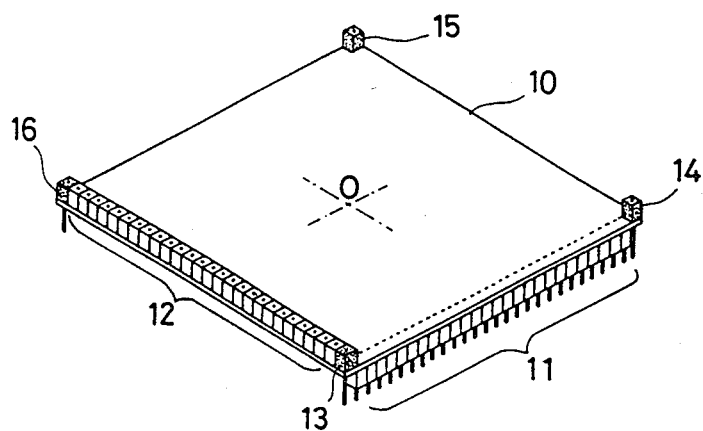
FIG. 3 is a perspective view of a first printed circuit board.

Each of the printed circuit boards 10, 20, 30, and 40 is provided, on the bottom face thereof at one side of the square, with each of male third connectors 11, 21, 31, and 41, respectively, and is provided, on the top face thereof at a side adjacent to the side having the third connector, with each of female fourth connectors 12, 22, 32, and 42, respectively. Each terminal arrangement of the third connectors, 11, 21, 31, and 41 is the same as that of the first connector 51. Each of the terminals of the fourth connectors 12, 22, 32, and 42 is connected to each of the terminals of the third connectors 11, 21, 31, and 41 on the circuit board, respectively. The board 10 is provided, at each position confronting the second connectors 52, 53, 54, and 55 of the board 50, with fifth connectors 13, 14, 15, and 16, respectively (FIG. 3). The board 20 is provided, at each position confronting the fifth connectors 13, 14, 15, and 16 of the board 10, with fifth connectors 23, 24, 25 and 26 (26 not shown), respectively. The boards 30 and 40 are provided with fifth connectors 33, 34, 35 and 36 (36 not shown) and 43, 44, 45, and 55, respectively, in the same manner.

Figure 4:
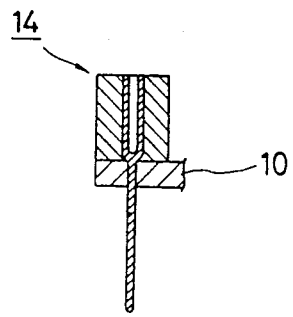
FIG. 4 is an enlarged sectional view of a fifth connector.

These fifth connectors 13-16, 23-26, 33-36, and 43-46 are attached through the printed circuit boards 10, 20, 30, and 40, respectively. Each underside of these fifth connectors is formed as a male type and each topside of these is formed as a female type. FIG. 4 is an enlarged sectional view of the connector 14. The other fifth connectors are also composed in the same manner.

Here, each of the boards 10, 20, . . . is 60 by 60 millimeters in size and 0.8 millimeter in thickness, for example. As shown in FIG. 1, CMOS memory chips 62, which are of low power consumption and formed in flat package, are mounted in the middle of each of the boards. The memory capacity of one of the printed circuit boards is 256 kilo-bytes in this embodiment. Each connector is formed with a height of 2.5 millimeters. The printed circuit boards are spaced at intervals of 5.0 millimeters. The memory chips 62 are omitted in FIGS. 2 and 3. The memory chips 62 may be directly mounted on the printed circuit board without packaging.

The method of stacking the above printed circuit boards will now be explained. First, the third connector 11 of the first board 10 is coupled to the first connector 51 of the board 50, while the fifth connectors 13, 14, .. . of the first board 10 are coupled to the second connectors 52, 53, . . . of the board 50. Next, the second board 20 is turned from the same position as the first board 10 by the amount of one side of the square around its center point to have the third connector 21 coupled to the fourth connector 12 of the first board 10 and the fifth connectors 23, 24, . . . of the second board 20 coupled to the fifth connectors 13, 14, . . . of the first board 10. Further, the third board 30 is turned from the same position and in the same direction as the second board 20 by the amount of one side of the square around its center point to have the third connector 31 coupled to the fourth connector 22 of the second board 20 and the fifth connectors 33, 34, . . . of the third board 30 coupled to the fifth connectors 23, 24, . . . of the second board 20. Finally, the fourth board 40 is turned from the same position and in the same direction as the third board 30 by the amount of one side of the square around its center point to have the third connector 41 coupled to the fourth connector 32 of the third board 30 and the fifth connectors 43, 44, . . . of the fourth board 40 coupled to the fifth connectors 33, 34, . . . of the third board 30, to thereby finish stacking.

Consequently, the connector 52 is connected to the connector 43 through the connectors 13, 23, and 33. The connector 53 is connected to the connector 44 through the connectors 14, 24, and 34. The connector 54 is connected to the connector 45 through the connectors 15, 25, and 35. The connector 55 is connected to the connector 46. If a selecting signal of a desired printed circuit board is transmitted from the decoder 60, data is read out and written in the memory chip 62 mounted on the desired board.

Thus, all of the printed circuit boards can be composed of the same circuit making mass production possible. A memory unit with a large memory capacity of about 1 mega-byte, equal to four times 256 kilo-byte, can be constructed in an extremely narrow space of 60 by 60 by 25.7 millimeters in this embodiment. Further, if memory chips are mounted on both faces of each of the printed circuit boards, the memory capacity can be increased up to about 2 mega-byte, as much as a hard disk, in the same space. Furthermore, by setting only the CMOS memory chips of one among the four printed circuit boards to an operating mode and those on the rest of the boards to a stand-by mode, the overall power consumption can be reduced.

Figure 5:
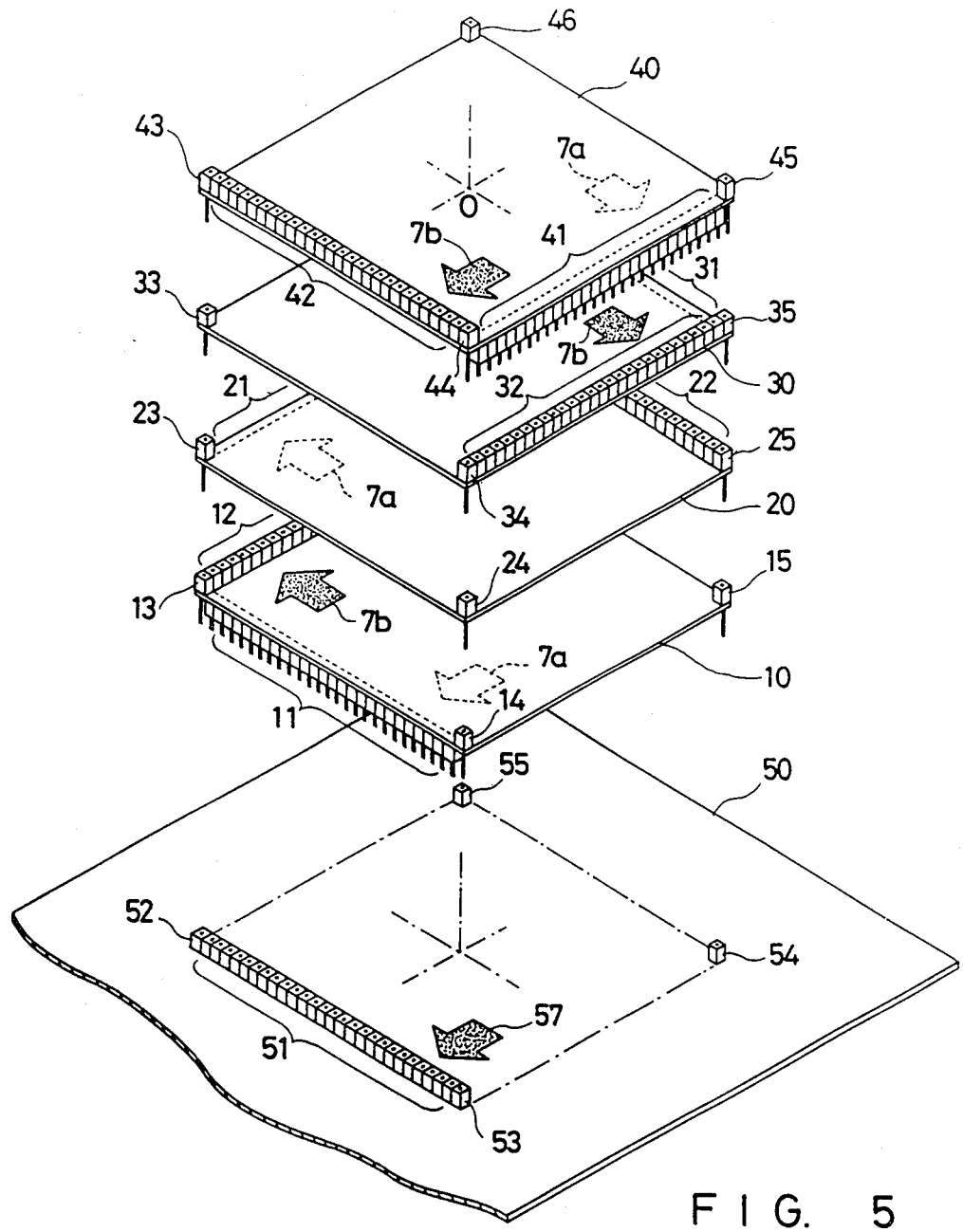
FIG. 5 is a perspective assembly view of the printed circuit boards of FIG. 1 with joint marks.

Here, as shown in FIG. 5, a first joint mark 7a which indicates a side where a third connector is arranged, is attached to each bottom face of the boards 10, 20, . . . , and a second joint mark 7b, which indicates a side where a fourth connector adjacent to the above side is arranged, is attached to each top face of the boards 10, 20, . . . . On the other hand, a third joint mark 57, which confronts the first joint mark 7a when the first board 10 is mounted, is attached to the mother board 50. Stacking the printed circuit boards 10, 20, . . . so these marks face each other enables accurate and quick mounting work.

The number of printed circuit boards is not limited to four as above. By changing "N" of the regular N-sided polygon to number other than four, another regular polygon and another number of sheets are possible.

Figure 6:
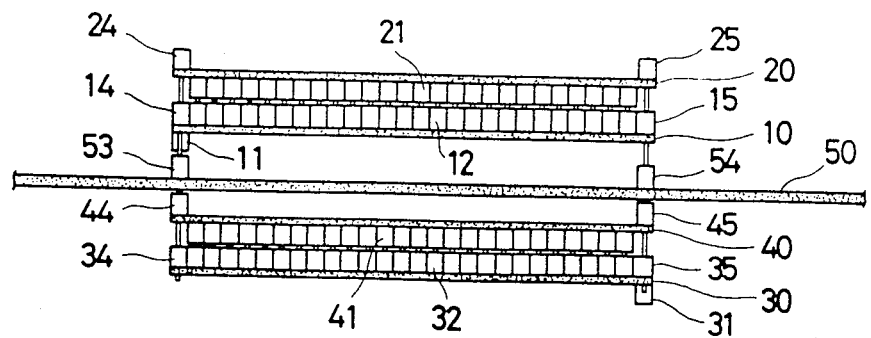
FIG. 6 is a front view of a method for stacking printed circuit boards in a second embodiment of this invention.

FIG. 6 shows a stacking method of a second embodiment of this invention. In this embodiment, the first connector 51 and the second connectors 52, 53, 54, and 55 as shown in FIG. 1 are attached through the mother board 50. They are provided on both faces thereof with the underside as male types and the topside as female types. As shown in FIG. 6, the boards 10 and 20 are provided on the top face of the board 50 and the boards 30 and 40 are provided on the bottom face of the board 50. Thus, the height of the highest printed circuit board from the mother board 50 is reduced. The stacked printed circuit boards do not readily detach from the mother board by external force and thus become more stable. Three printed circuit boards may be stacked on the top face of the mother board 50 and one board on the bottom face, for example. The male connectors of the lowest printed circuit board 30 stacked on the bottom face are preferably cut off. Alternatively, it is possible not to provide any female connector on the highest printed circuit board 20 or any male connector on the lowest printed circuit board 30.

Figure 7:
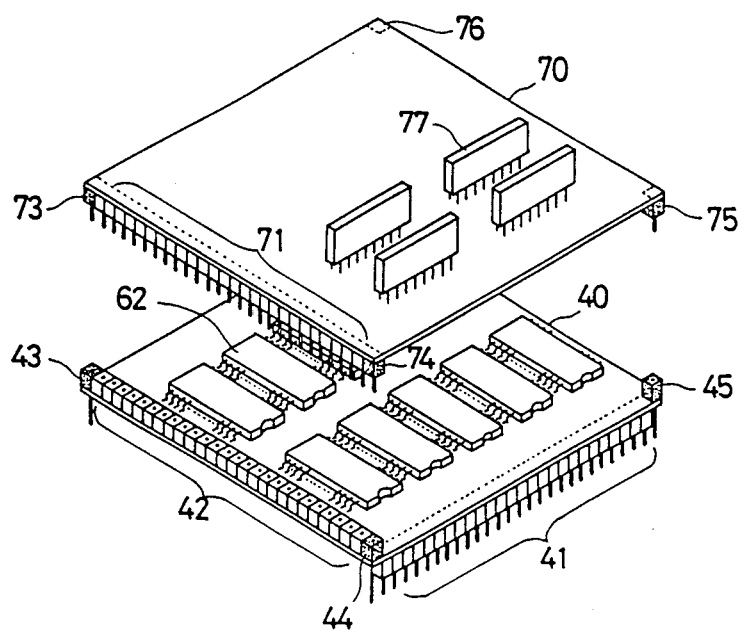
FIG. 7 is a perspective view of a terminal board and the highest printed circuit board of a third embodiment of this invention.

FIG. 7 shows a third embodiment of this invention. As shown in FIG. 7, a terminal board 70 is coupled to the highest printed circuit board 40. The terminal board 70 is provided on the bottom face with a sixth connector 71 for coupling to the fourth connector 42 attached to the top face of the highest printed circuit board 40 and seventh connectors 73, 74, 75, and 76 for coupling to the fifth connectors 43, 44, 45, and 46 attached to the top face of the highest board 40. The terminal board 70 is provided on the top face with terminal resistors 77, which are connected to the sixth connector 71 and the seventh connectors 73, 74, 75, and 76.

Consequently, even if the total length of the same signal line of the printed circuit boards 10, 20, 30, and 40 become considerably longer, attachment or detachment of the terminal board 70 from the board 40 to select terminal treatment of the detachable terminal board 70, or proper adjustment of the resistance value of the terminal resistors 77 can prevent a signal reflection from the highest printed circuit board 40. In the above embodiment, although it is shown to mount the terminal board 70 on the fourth printed circuit board 40, the terminal board 70 can be mounted on the printed circuit board 30 when the number of printed circuit boards is fewer than four, for example, the third printed circuit board 30 becomes the highest. The mounting position of the resistors on the terminal board may be either on the top or bottom face of the terminal board. However, attachment of the terminal resistors on the bottom face of the board enables a higher density stacking method.

FIGS. 8 and 9 show a fourth embodiment of this invention. In this embodiment, as shown in FIG. 8, the mother board 50 is provided, at a side confronting the first connector 51, with an eighth connector 51a. As shown in FIG. 9, the printed circuit board 10 is provided, at a side confronting the third connector 11, with a ninth connector 11a and is provided, at a side confronting the fourth connector 12, with a 10th connector 12a, respectively. Each of the terminals of the 10th connector 12a is connected to each of the terminals of the ninth connector 11a on the circuit board 10, respectively. Additional data signal lines are connected to the ninth and 10th connectors 11a and 12a. Although not shown, the printed circuit boards 20, 30, and 40 are also composed as shown in FIG. 9.

The above printed circuit boards are stacked in the same manner as FIG. 1. Use of an error correcting bit signal or extended data signals in the case of having extended a data bus as additional data signals enables a wider range of use of the printed circuit board. Also, arrangement of the connectors at least at two sides of the square enables strong mounting wherein the printed circuit boards will not incline and will not easily detach even if external force is applied from above. Further, when removing a printed circuit board, one side will not come off first since the connecting force of the boards is uniform.

Figure 10:
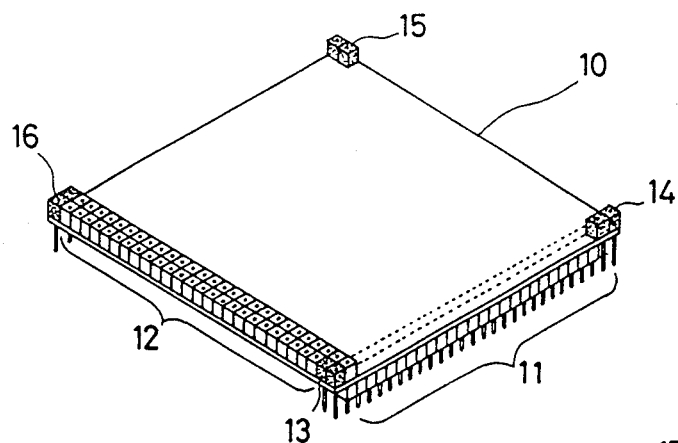
FIGS. 10 and 11 are a perspective view of a printed circuit board of another embodiment.
Figure 11:
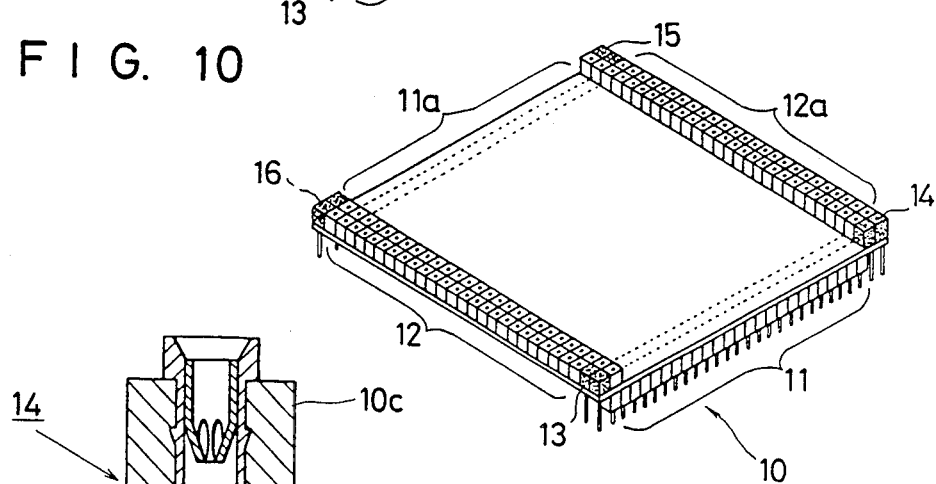
Figure 12:
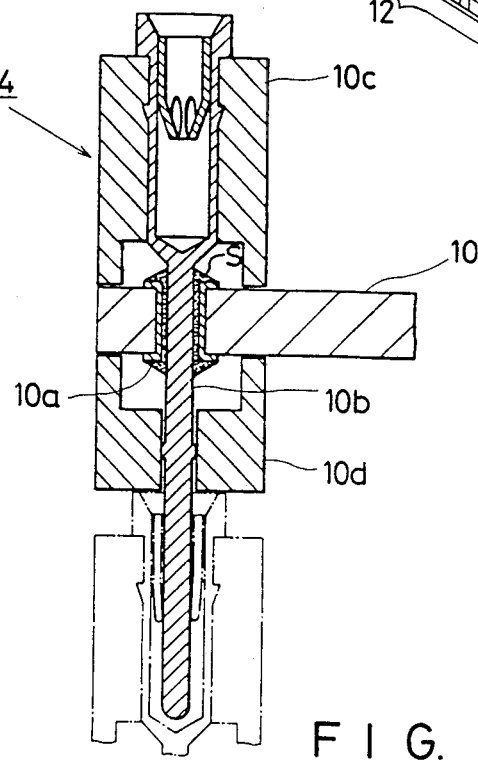
FIG. 12 is an enlarged sectional view of a fifth connector of another embodiment.

The number of printed circuit boards shown in FIG. 9 is not limited to four as above. By changing "N" of the regular N-sided polygon to five or more, the number of boards may be made five or more. The second and fifth connectors for selecting signals of the printed circuit boards may each have two or more terminals, instead of a single terminal. In the case of increasing data signal lines, the third and fourth connectors of the printed circuit boards may be arranged in two or more lines along a side, instead of in a single line. FIG. 10 shows one example. In the case of further increasing the data signal lines, the third, fourth, ninth, and 10th connectors may be arranged in two (FIG. 11) or more lines along a side. The arrangement of the second and fifth connectors is not limited to the four corners of the square. There may be employed the method of arranging "N" connectors at 360/N degree intervals around the center point of the regular N-sided polygon. Further, the shape of the connector of this invention is not limited in FIG. 4. A connector shown in FIG. 12 can be used, where a through hole 10a is provided through the printed circuit board 10, inserting a pin 10b whose top face is hollow into the hole 10a so as to project the upper end of the pin 10b therefrom, fixing the pin 10b thereinto with solder "s" in the condition of projecting the pin 10b to the bottom face of the board 10. The pointed end of a pin fixed to an upper board is inserted into the hollow part of the pin 10b. The numeral 10c indicates an insulating block and the numeral 10d indicates an insulating spacer.

Figure 13:
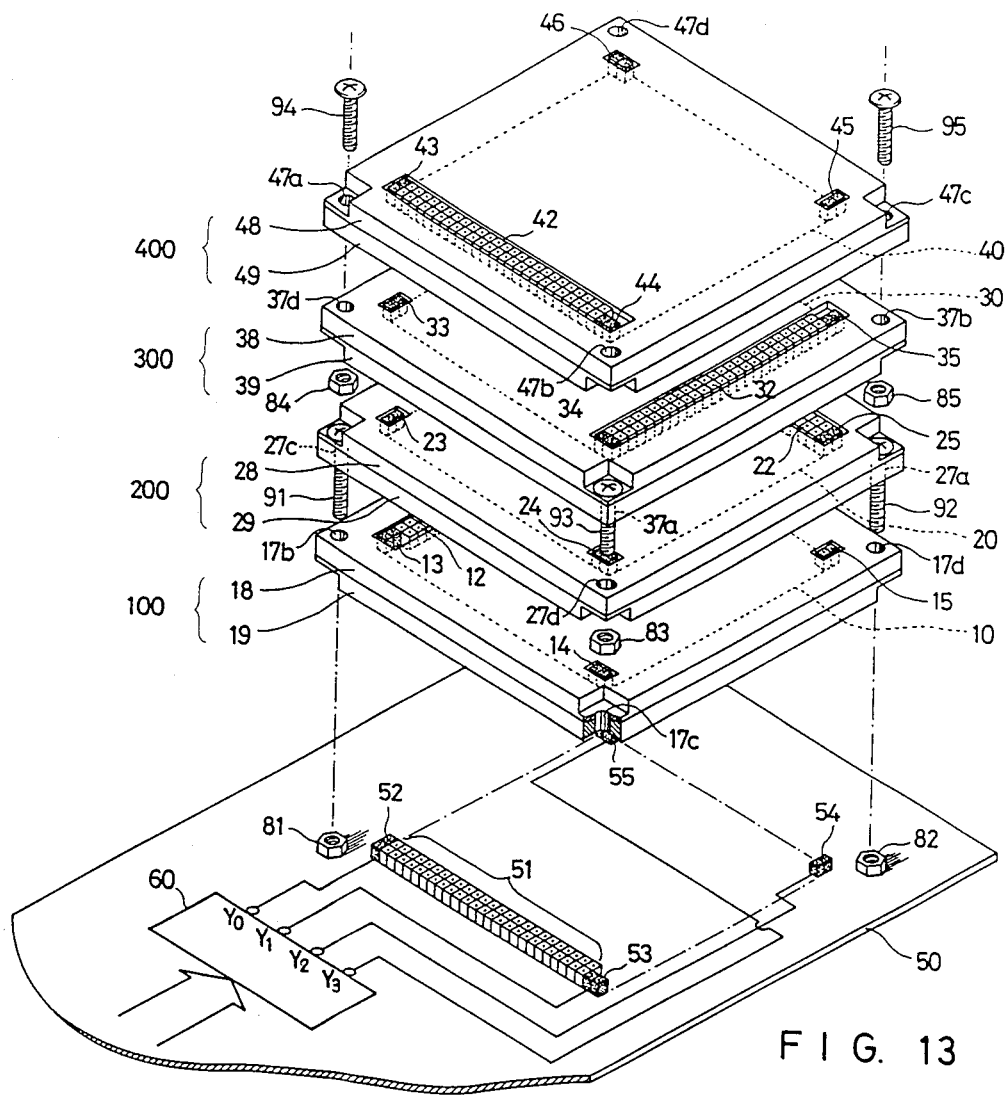
FIG. 13 is a perspective assembly view of a method for stacking printed circuit boards in a fifth embodiment of this invention.

FIG. 13 shows a fifth embodiment of the invention. The characteristic composition of this embodiment is to encase and hold the printed circuit boards 10–40 in packages 100–400 comprising an upper lid and a lower lid, respectively. The explanation will be made in detail referring to a package 100 encasing and holding the printed circuit board 10.

Figure 16:
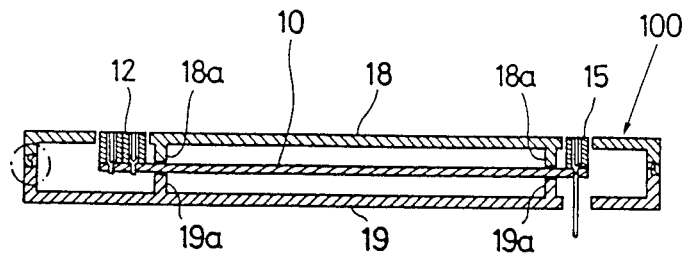
FIG. 16 is a cross-sectional view taken along line A—A of FIG. 14.
Figure 17:
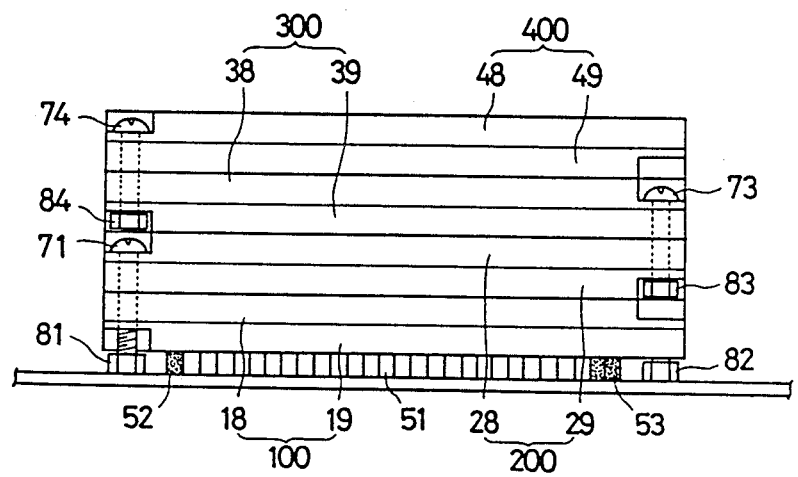
FIG. 17 is a front view in the stacked condition.
Figure 18:
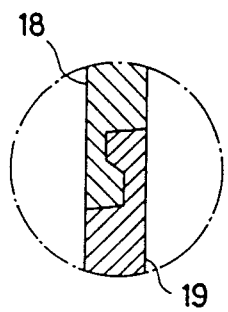
FIG. 18 is an enlarged sectional view of a part encircled by alternate long and short dash line in FIG. 16.

As shown in FIG. 14–FIG. 16, the board 10 is encased and held in the package 100 comprising an upper lid 18 and a lower lid 19. The upper lid 18 and the lower lid 19 are molded from synthetic resin, for example, ABS resin. The joining parts of the fringe are formed hooked in shape as shown in FIG. 18, so as to fasten to each other by elastic force. Each inside of the lids 18 and 19 is provided at the same position with convexes 18a and 19a, so as to grasp the board 10 when joining the lids 18 and 19 to each other (FIG. 16). The convexes 18a and 19a are provided at positions where no parts of the printed circuit board 10 are arranged. The lids 18 and 19 are apertured at positions corresponding to the connectors 11–16, and are provided at the four corners with through holes 17a, 17b, 17c, and 17d. The height of the top face of the lid 18 and the bottom face of the lid 19 is coincident with the height of the insulating block ends of the connectors 11–16 of the board 10, respectively. A cavity deeper than the height of a male screw head, mentioned later, is formed at each of the upper parts of the holes 17a and 17c. A cavity deeper than the height of a female screw, mentioned later, is formed at each of the lower parts of the holes 17b and 17d (FIG. 17).

Figure 19:
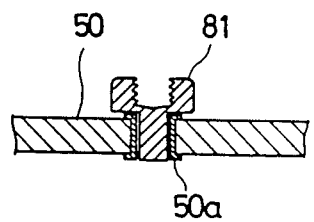
FIG. 19 is a partial, enlarged sectional view of a mother board.

As shown in FIG. 13, the printed circuit boards 20, 30 and 40 are also encased and held in packages 200, 300, and 400 comprising upper lids 28, 38, and 48 and lower lids 29, 39, and 49, respectively, in the same manner as the printed circuit board 10. The boards 20, 30, and 40 are provided at the four corners with through holes 27a, 27b, 27c, 27d (27b not shown), 37a, 37b, 37c, 37d (37c not shown), and 47a, 47b, 47c, 47d, respectively. The mother board 50 is provided at positions adjacent to the connectors 52 and 54 with female screws 81 and 82. The base of the screw 81 (82) is fixed in a through hole 50a of the mother board 50 as shown in FIG. 19.

The method of stacking the four printed circuit boards encased in the package will now be explained on the basis of FIGS. 13 and 1.

First, the printed circuit boards 10, 20, 30, and 40 are encased and held in the packages 100, 200, 300, and 400 comprising the upper lids 18, 28, 38, and 48 and the lower lids 19, 29, 39, and 49, respectively. Next, the third connector 11 of the first board 10 is coupled to the first connector 51 of the mother board 50, while the fifth connectors 13, 14, . . . of the first board 10 are coupled to the second connectors 52, 53, . . . of the board 50. Further, the second package 200 is turned, from the same position as the first package 100, 90 degrees around the center point of the square to have the third connector 21 of the second board 20 coupled to the fourth connector 12 of the first board 10 and the fifth connectors 23, 24, . . . of the second board 20 coupled to the fifth connectors 13, 14 . . . of the first board 10. Here, a male screw 91 is inserted into the hole 27c of the package 200, through the hole 17b of the package 100, and is set in the female screw 81 of the board 50. Also, a male screw 92 is inserted into the hole 27a of the package 200 and through the hole 17d of the package 100, to be set in the female screw 82 of the board 50, thereby fixing the two packages 100 and 200 on the board 50.

Furthermore, the third package 300 is turned, from the same position and to the same direction as the second package 200, 90 degrees around the center point of the square to have the third connector 31 of the third board 30 coupled to the fourth connector 22 of the second board 20 and the fifth connectors 33, 34, ... of the third board 30 coupled to the fifth connectors 23, 24, ... of the second board 20. Here, a male screw 93 is inserted into the hole 37a of the package 300 and through the hole 27d of the package 200, to be set in a female screw 83. A male screw, not shown, is also inserted into holes of the packages 300 and 200, located diagonally opposite the holes 37a and 27d to be set in a female screw, thereby fixing the package 300 on the package 200.

Finally, the fourth package 400 is turned, from the same position and to the same direction as the third package 300 90 degrees around the center point of the square to have the third connector 41 of the fourth board 40 coupled to the fourth connector 32 of the third board 30 and the fifth connectors 43, 44, ... of the fourth board 40 coupled to the fifth connectors 33, 34, ... of the third board 30. The package 400 is fixed to the third package 300 by a male screw 94 and a female screw 84 and a male screw 95 and a female screw 85 in the same manner as the package 300.

Consequently, the second connector 52 is connected to the fifth connector 43 through the fifth connectors 13, 23, and 33. The second connector 53 is connected to the fifth connector 44 through the fifth connectors 14, 24, and 34. The second connector 54 is connected to the fifth connector 45 through the fifth connectors 15, 25, and 35. The second connector 55 is connected to the fifth connector 46. As shown in FIG. 17, at that time, the four boards 10, 20, 30, and 40 are stacked encased in the packages 100, 200, 300, and 400, each comprising upper and lower lids, so as to be strongly fixed on the board 50 without gap by the screws 91, 92, .... Even if external forces are applied to the packages, the printed circuit boards can be stacked strongly without damage. Even if vibrations arise, no imperfect contact occurs because of the affixment by the fasteners, so that mounting with extremely high reliability is possible. When treating the package with the printed circuit board as a part, the electronic parts and their circuit composition can be protected from the outer environment because of the printed circuit board are encased by the upper and lower lids.

Figure 20:
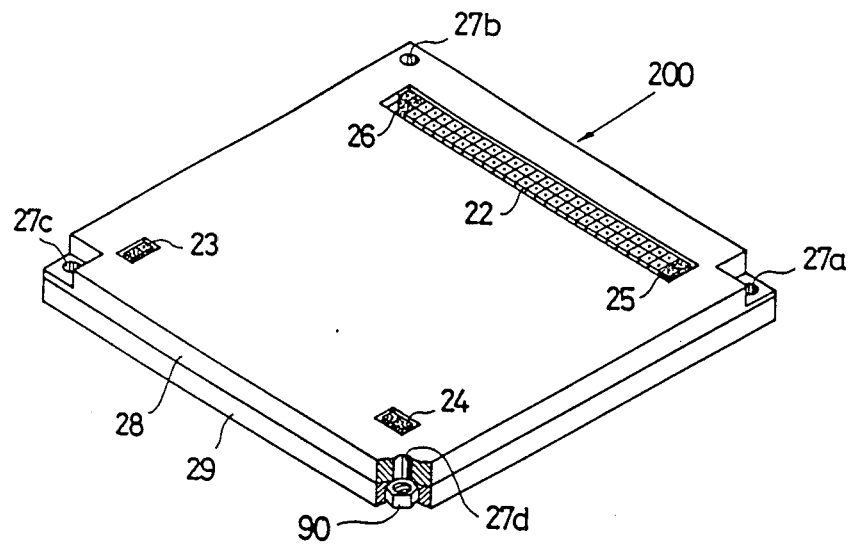
FIG. 20 is a partially cutaway perspective view of the package encasing a second printed circuit board of another embodiment.
Figure 24:
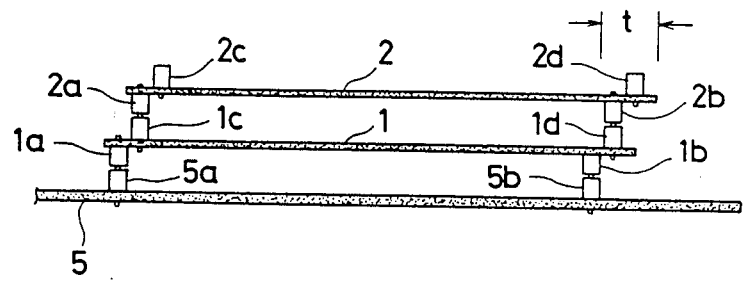
FIG. 24 is a front view of a method for stacking printed circuit boards of the prior art.

FIG. 20 shows another embodiment of this invention. The characteristic point of this embodiment is to set two nuts 90 etc. (another not shown) in the lower lid 29 of the package 200 encasing the second printed circuit board without providing the lower parts of the through holes 27b and 27d with cavities. If the lower lid of the package 300 encasing the third printed circuit board is also composed in the same manner, the four packages can be mounted on the mother board 50 by just screwing with a screwdriver.

The lower lid may be provided with a female thread taps instead of the above nuts. In the above embodiment, although it is shown to fix the two packages to each other by means of male and female screws, the fixing means of the packages is not limited to male and female screws and other fasteners can be used. For example, by inserting a fastener formed in a key-shape into a hole formed in a keyhole-shape and then giving the fastener a half turn, the two packages may be fixed.

FIG. 21 shows a sixth embodiment of this invention. The characteristic composition of this embodiment is to provide on the bottom face of the mother board 50, 11th and 12th connectors 51b and 51c corresponding to the first and eighth connectors 51 and 51a provided on the top face of the mother board 50 described in the fourth embodiment (FIG. 8). Each of the terminals of the 11th connector 51b is connected to each of the terminals of the first connector 51 on the board and each of the terminals of the 12th connector 51c is connected to each of the terminals of the eighth connector 51a. The 11th connector 51b is provided at a side adjacent to the first connector 51. The 12th connector 51c is provided at a side adjacent to the eighth connector 51a. Boards composed in the same manner as the fourth embodiment (FIG. 9) are used as printed circuit boards 10, 20, ....

In this embodiment, four printed circuit boards each are stacked on the top face and bottom face of the mother board 50. Namely, the printed circuit boards 10, 20, 30, and 40 are stacked on the top face of the mother board 50 and the printed circuit boards 110, 120, 130, and 140 are stacked on the bottom face of the mother board 50. The boards 10 and 110 are selected when a selecting signal arrives at the second connector 52. The boards 20 and 120 are selected when a selecting signal arrives at the second connector 53. The boards 30 and 130 are selected when a selecting signal arrives at the second connector 54. The boards 40 and 140 are selected when a selecting signal arrives at the second connector 55. By placing the printed circuit boards on two sides, stable stacking is possible. The next circuit composition gives secondary effects.

Figure 22:
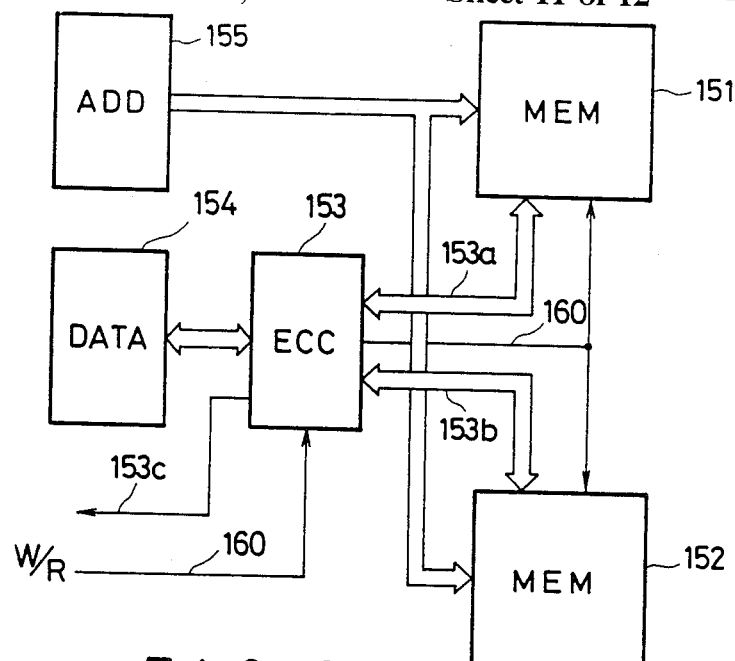
FIGS. 22 and 23 are block diagrams of application of the stacking method of this invention.

FIG. 22 is a block diagram of an error detecting/correcting circuit where the above stacking method is applied. A memory unit 151 consists of memory chips provided on the printed circuit boards 10, 20, 30, and 40 stacked on the top face of the mother board 50. A memory unit 152 consists of memory chips provided on the printed circuit boards 110, 120, 130, and 140 stacked on the bottom face of the mother board 50. The numeral 153 indicates an error correcting code generating/correcting circuit. The numeral 154 indicates a data buffer. The numeral 154 indicates an address buffer. Address signals from the address buffer 155 are fed to the memory unit 151 through the first connector 51, each of the third connectors 11, 21, 31, and 41, and each of the fourth connectors 12, 22, 32, and 42 shown in FIG. 21 and are fed to the memory unit 152 through the 11th connector 51b, each of the fourth connectors 112, 122, 132, and 142, and each of the third connectors 111, 121, 131, and 141 shown in FIG. 21. Data transmitted from the data buffer 154 consists of 16 bits in this embodiment, to which is added an error correcting code by the generating/correcting circuit 153. The 16 bits of data are written in the memory unit 151, while the error correcting code of six bits is written in the memory unit 152. The data 153a from the generating/correcting circuit 153 is fed to each of the 10th connectors 12a, 22a, 32a, and 42a through the eighth connector 51a and each of the ninth connectors 11a, 21a, 31a, and 41a shown in FIG. 21. The error correcting code 153b from the generating/correcting circuit 153 is fed to each of the ninth connectors 111a, 121a, 131a, and 141a through the 12th connector 51c and each of the 10th connectors 112a, 122a, 132a, and 142a, shown in FIG. 21. The data and error correcting code is written or read together with write/read timing signals. The data 153a and error correcting code 153b which have been read are checked at the generating/correcting circuit 153. When data has one bit error, the data is corrected. When data has two or more bits error, an error signal 153c is transmitted. Thus, the reliability of the memory can be enhanced.

Figure 23:
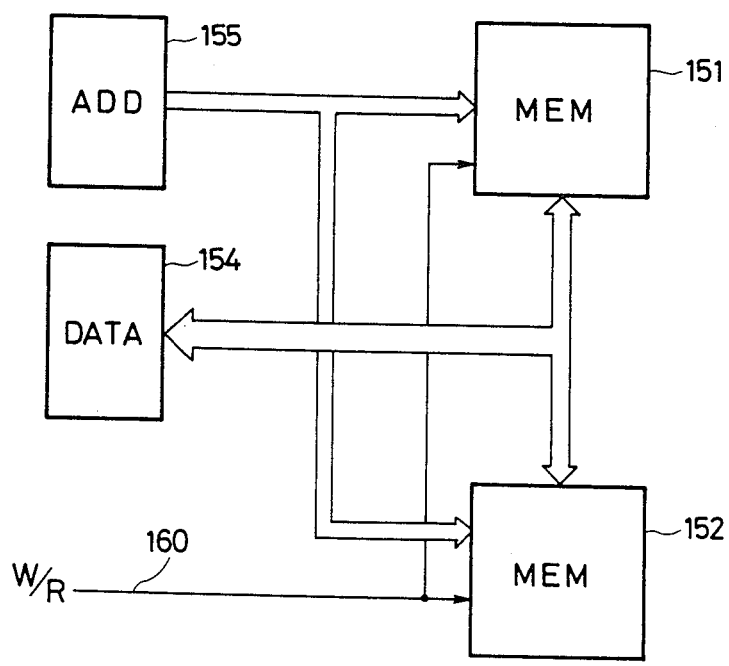

FIG. 23 is a block diagram for expanding the memory capacity by applying the above stacking method. Memory units 151 and 152 are composed in the same manner as FIG. 22. The output of the address buffer 155 is connected to the memory units 151 and 152 in the same manner as FIG. 22. Data from the data buffer 154 consists of 32 bits in this embodiment and is divided in 16 bits between the memory units 151 and 152 to be memorized. Thus, the number of bits for data can be increased.

INDUSTRIAL APPLICABILITY

As mentioned above, the method of stacking printed circuit boards of this invention is useful in the case of mounting, in super-high density, memory boards in a small space on the mother board placed within an electronic device. Particularly, it is suitable in the case of constructing a memory of extremely large capacity.

I claim:

1. A method for stacking printed circuit boards, wherein a plurality of printed circuit boards, having electronic parts comprising circuits mounted thereon, are stacked on a mother board, comprising:

forming N printed circuit boards, respectively, in the same size and shape of a regular N-sided polygon, where N is an integer not less than three;

providing said mother board, at a position corresponding to one side of said regular N-sided polygon, with a first connector in which terminals of a data bus line, an address bus line, and a timing signal line for reading/writing data are arranged, and providing said mother board, at 360/N-degree intervals around a center point of said regular N-sided polygon, with N second connectors, each consisting of one or more terminals, for selecting said printed circuit boards;

providing each of said printed circuit boards, on one face thereof at one side of said regular N-sided polygon, with a third connector in which terminals are arranged in the same manner as said first connector, providing each of said printed circuit boards, at a side adjacent to said side having said third connector, with a fourth connector, each of whose terminals is connected to each of the terminals of said third connector thereon, respectively, and providing each of said printed circuit boards, on both faces thereof penetrating therethrough at positions confronting said N second connectors of said mother board, with N fifth connectors for coupling to said second connectors, respectively; and stacking said N printed circuit boards on said mother board by rotating an $n+1^{th}$ printed circuit board about an axis which is perpendicular to said mother board and passing through the center point of said regular N-sided polygon of an $n^{th}$ printed circuit board through an angle of 360/N degree, where n is a positive number less than N.

2. A method for stacking printed circuit boards as claimed in claim 1, wherein said stacking step comprises stacking all of said N printed circuit boards on a single face of said mother board.

3. A method for stacking printed circuit boards as claimed in claim 2, further comprising providing each of said printed circuit boards with a first joint mark at a bottom face thereof which indicates a specific side of said regular N-sided polygon, providing each of said printed circuit boards with a second joint mark at a top face thereof which indicates a side adjacent to said specific side, and providing said mother board with a third joint mark which confronts said first joint mark when said printed circuit board is mounted thereon.

4. A method for stacking printed circuit boards as claimed in claim 2, further comprising mounting, on a topmost printed circuit board, a terminal board having a sixth connector for coupling to said fourth connector, seventh connectors for coupling to said fifth connectors, and terminal resistors connected to said sixth and seventh connectors.

5. A method for stacking printed circuit boards as claimed in claim 1, wherein said step of providing said mother board with said first connector and said N second connectors comprises penetrating said mother board, on both faces thereof, therethrough with said first and second connectors, wherein part of the N printed circuit boards are stacked on one face of said mother board and the rest of said N printed circuit boards stacked on the opposite face of said mother board.

6. A method for stacking printed circuit boards, wherein four printed circuit boards formed as squares of the same specification and the same size are mounted with electronic parts comprising circuits, and are stacked on a mother board by rotating an $n'+1^{th}$ printed circuit board about an axis which is perpendicular to said mother board and passing through the center point of said square of and $n'^{th}$ printed circuit board, 90 degrees, where n;' is a positive number less than four, comprising:

providing each of said printed circuit boards, at one side, with a third connector for coupling to said mother board or a lower printed circuit board, providing each of said printed circuit boards, at a side adjacent to said one side, with a fourth connector for coupling to an upper printed circuit board, and providing each of said printed circuit boards, on both faces thereof penetrating therethrough, with fifth connectors, each consisting of one or more terminals, for selecting said printed circuit boards and for interconnecting the upper printed circuit boards and either said mother board or the lower printed circuit board;

connecting each of the terminals of said fourth connectors to each of the terminals of said third connectors;

encasing and holding each of said printed circuit boards in a package comprising an upper lid and a lower lid;

providing said packages, at parts where said third, fourth, and fifth connectors of the stacked printed circuit boards are interconnected, with apertures, and providing said package, at four corners thereof, with through holes;

stacking said packages two by two; and inserting fasteners into two non-adjacent holes among the four holes, so as to fix said packages to each other.

7. A method for stacking printed circuit boards, wherein a plurality of printed circuit boards mounted with electronic parts comprising circuits are stacked on mother board, comprising:

forming said printed circuit boards, respectively, in the same size and shape of a regular M-sided polygon, where M is an integer not less than four;

providing said mother board, at positions corresponding to two non-adjacent sides of said regular M-sided polygon, with first and eighth connectors in which terminals of a data bus line, an address bus line, and a timing signal line for reading/writing data are arranged, and providing said mother board, at 360/M-degree intervals around a center point of said regular M-sided polygon, with M second connectors, each consisting of one or more terminals, for selecting said printed circuit boards;

providing each of said printed circuit boards, on one face thereof at two non-adjacent sides of said regular M-sided polygon, with third and ninth connectors which are located in the same relation, in which terminals are arranged in the same manner as said first and eighth connectors, providing each of said printed circuit boards, on an opposite face thereof at each of sides adjacent to said sides having said third and ninth connectors, with fourth and 10th connectors each of whose terminals is connected to each of the terminals of said third and ninth connectors thereon, respectively, and providing each of said printed circuit boards, on both faces thereof penetrating therethrough at positions confronting said M second connectors of said mother board, with M fifth connectors for coupling to said second connectors, respectively; and stacking said M printed circuit boards on said mother board by rotating an $m+1^{th}$ printed circuit board about an axis which is perpendicular to said mother board and passing through the center point of said regular M-sided polygon of an $m^{th}$ printed circuit board, through an angle of 360/M degree, where m is a positive number less than M.

8. A method for stacking printed circuit boards as claimed in claim 7, wherein said stacking step comprises stacking all of said printed circuit boards on a single face of said mother board.

9. A method for stacking printed circuit boards as claimed in claim 7, wherein said step of providing said mother board with said first, eighth and second connectors comprises penetrating said mother board, on both faces thereof, therethrough with said first, eighth, and second connectors, wherein part of said plurality of printed circuit boards are stacked on one face of said mother board, and the rest of said boards are stacked on the opposite face of said mother board.

10. A method for stacking printed circuit boards, wherein a plurality of printed circuit boards mounted with electronic parts comprising circuits are stacked on a mother board, comprising:

forming said printed circuit boards, respectively, in the same size and shape of a regular M-sided polygon;

providing said mother board, on a top face at positions corresponding to two non-adjacent sides of said regular M-sided polygon, with first and eighth connectors for coupling to said printed circuit boards, in which terminals of a data bus line, an address bus lines, and a timing signal line for reading/writing data are arranged, providing said mother board, on a bottom face at each of sides adjacent to said sides having said first and eighth connectors, with 11th and 12th connectors each of whose terminals is connected to each of the terminals of said first and eighth connectors therein, respectively, and providing said mother board, on both faces thereof penetrating therethrough at 360/M-degree intervals around the center point of said regular M-sided polygon, with M second connectors, each consisting of one or more terminals, for selecting said printed circuit boards;

providing each of said printed circuit boards, on one face thereof at two non-adjacent sides with third and ninth connectors which are loacted in the same relation, in which terminals are arranged in the same manner as said first and eighth connectors, providing each of said printed circuit boards, on an opposite face thereof at each of sides adjacent to said sides having said third and ninth connectors, with fourth and 10th connectors which are located in the same relation, in which terminals are arranged in the same manner as said 11th and 12th connectors and providing each of said printed circuit boards, on both faces thereof penetrating therethrough at positions confronting said M second connectors of said mother boards, with M fifth connectors for coupling to said second connectors, respectively; and stacking said plurality of printed circuit boards on both faces of said mother board by rotating an $m+1^{th}$ printed circuit board about an axis which is perpendicular to said mother board and passing through the center point of said regular M-sided polygon of an $m^{th}$ printed circuit board, through an angle of 360/M degree.

* * * * *